(12) United States Patent
Jolley

(10) Patent No.: US 9,136,411 B2
(45) Date of Patent: Sep. 15, 2015

(54) SOLAR PANEL CLAMP SYSTEM

(71) Applicant: SOLARCITY CORPORATION, San Mateo, CA (US)

(72) Inventor: Mike Jolley, San Mateo, CA (US)

(73) Assignee: SolarCity Corporation, San Mateo, CA (US)

( * ) Notice: Subject to any disclaimer, the term of this patent is extended or adjusted under 35 U.S.C. 154(b) by 0 days.

(21) Appl. No.: 14/502,837

(22) Filed: Sep. 30, 2014

(65) Prior Publication Data

US 2015/0047177 A1  Feb. 19, 2015

Related U.S. Application Data

(63) Continuation of application No. 13/552,395, filed on Jul. 18, 2012, now Pat. No. 8,875,401.

(51) Int. Cl.
*F24J 2/52* (2006.01)
*H01L 31/042* (2014.01)
*B23P 19/04* (2006.01)
*F16M 13/02* (2006.01)

(52) U.S. Cl.
CPC ............ *H01L 31/0422* (2013.01); *B23P 19/04* (2013.01); *F16M 13/02* (2013.01); *F24J 2/5254* (2013.01); *F24J 2/5256* (2013.01); *Y10T 29/49616* (2015.01); *Y10T 29/49623* (2015.01); *Y10T 29/49627* (2015.01); *Y10T 29/49947* (2015.01)

(58) Field of Classification Search
CPC .... H01L 31/0422; F24J 2/5254; F24J 2/5256; B23P 19/04; F16M 13/02; Y10T 29/49947; Y10T 29/49623; Y10T 29/49627; Y10T 29/49616

See application file for complete search history.

(56) References Cited

U.S. PATENT DOCUMENTS

| 5,491,943 | A | * | 2/1996 | Vondrejs et al. | ................. 52/239 |
| 8,640,401 | B2 | | 2/2014 | Hong et al. | |
| 8,875,401 | B2 | | 11/2014 | Jolley | |
| 2008/0302407 | A1 | * | 12/2008 | Kobayashi | .................... 136/251 |

OTHER PUBLICATIONS

Non-Final Office Action for U.S. Appl. No. 13/552,395, mailed May 1, 2014, 6 pages.
Notice of Allowance for U.S. Appl. No. 13/552,395, mailed Jun. 23 2014, 5 pages.

* cited by examiner

*Primary Examiner* — Richard Chang
(74) *Attorney, Agent, or Firm* — Kilpatrick Townsend & Stockton LLP

(57) ABSTRACT

In one embodiment the present invention includes a solar panel clamp system for mounting solar panels on ground-level and raised purlins. Such systems include left-handed and right-hand clamps that can be attached to opposite sides of solar panel assemblies that include mounting frames. Left-handed clamps can attach to the mounting frame of a solar panel and include surfaces that can rest on the top surfaces of purlins and include a lip or shelf surface onto which the right-handed clamps of a mounting frame of a neighboring solar panel can rest to increase the speed and safety of installing solar panels on raised purlins. Through holes in the left-handed and right-handed clamps can then be used as guide holes for drilling into the purlins. The majority of, if not all of, the solar panel installation using the clamps of the present invention can be completed from underneath the raised purlins.

5 Claims, 7 Drawing Sheets

600

610 — Attach multiple left-handed clamps to one side of a solar panel mounting frame, and attach multiple right-handed clamps to the other side of the solar panel mounting frame for each of the solar panels to be installed to form a plurality of solar panel mounting assemblies.

620 — Position and hold the first solar panel mounting assembly in position between a first purlin and a second purlin by placing the side of the solar panel assembly having the left-handed clamps attached on the second purlin while holding the other side of the solar panel mounting assembly having the right-handed clamps attached, in position with the first purlin.

630 — Use through holes in the right-handed clamp of the first solar panel mounting assembly as guide holes for drilling through-holes in the first purlin.

640 — Fasten right-handed clamps of the first solar panel mounting assembly to the first purlin using the through-holes in the right-handed clamps and the drilled hole in the purlin.

650 — Position next solar panel mounting assembly with the right-handed clamps resting on the lip of the left-handed clamps of the previously installed solar panel mounting assembly and the left-handed clamps of the solar panel mounting assembly on the next purlin.

660 — Use through holes in the left-handed clamps of the previous solar panel mounting assembly and the right-handed clamps of the current solar mounting panel assembly as guide holes for drilling through holes in the current purlin.

670 — Fasten left-handed clamps of the previously installed solar panel mounting assembly and the right-handed clamps of the current solar mounting assembly to the current purlin using the through-holes in the left- and right-handed clamps and the drilled holes in the purlin.

*FIG. 6*

SOLAR PANEL CLAMP SYSTEM

BACKGROUND

The present invention relates to methods, systems, and devices for mounting solar panels, and in particular, to mounting systems for mounting solar panels on ground level and raised purlins.

Unless otherwise indicated herein, the approaches described in this section are not prior art to the claims in this application and are not admitted to be prior art by inclusion in this section.

Solar panels can be installed in a various locations on surfaces that would otherwise be used to provide shade or shelter. In particular, the roofs of buildings have become popular choices for the installation of solar panels in view of the fact that such solar collecting areas are typically underutilized. However installing solar panels on roofs and roofing systems presents a number of problems and complications with regard to waterproofing and fire prevention, due to the fact that many solar panel mounting systems require the addition of significant weight, and possibly penetrations into the waterproof membranes of the roof or roofing system.

To avoid the potential complications associated with installing solar panels on roofs or roofing systems, many solar power users/generators are opting to install solar panels at ground level on otherwise unused land, or to install solar panels in the raised structures to provide shade or basic rain shelter in areas with reduced weatherproofing requirements and/or less stringent fire code requirements. One popular area for installing solar panels for such rudimentary shade and rain shelters are both small and large scale carports or parking lots. In such installations, solar panels are installed directly onto the purlins of a post-and-beam structure. There is no need for a sub roof or underlayment. The solar panel themselves act as the shade and rain shelter structures.

To fasten the solar panels to the purlins, various systems, mounting brackets, clamps and other fasteners exist. However, most of these devices and methods for attaching the solar panels to the purlins of carports, or other similar shade and rain shelters, require installers to work with the solar panels, drill holes, and attach fasteners from above the post-and-beam structure. Not only is working with the solar panels from above post-and-beam structure arduous and cumbersome, resulting in higher installation costs, it can also be overly dangerous, thus increasing the probability that an installer is injured while installing solar panels.

Thus, there is a need for improved systems, devices, and methods for that reduce the time, cost, and, potential dangers associated with installing solar panels on post-and-beam structures. The present invention solves these and other problems by providing a solar panel clamp system that can be used to place and attach solar panel mounting assemblies to the purlins of a post-and-beam structure.

SUMMARY

Embodiments of the present invention improve systems for mounting solar panels. One embodiment the present invention includes a solar panel clamp assembly having a left-handed clamp that includes a lower structural arm, an upper structural arm. The upper structural arm can include a clamping structure, and be coupled to a first side of the lower structural arm at a first angle. The lower structural arm and can include a lip surface coupled to a second side of the lower structural arm at a second angle. Such embodiments can also include a right-handed clamp that can include a lower structural arm, an upper structural arm which can include a clamping structure, and be coupled to a first side of the lower structural arm at a first angle.

The second side of the lower structural arm of the right-handed clamp can dimensioned to fit against the second side of the left-handed clamp, and a first end of the right-handed clamp can be seated on the lip surface, such that a first surface of the clamping structure of the left-handed clamp matches up with a first surface of the clamping structure of the right-handed clamp. In other embodiments, a second surface of the clamping structure of the left-handed clamp and a second surface of the clamping structure of the right-handed clamp can include anchor elements. Such anchor elements can include angled pins or fins. In related embodiments, the upper structural arm of the left-handed clamp is configured to rest on a top surface of a purlin and the first side of the lower structural arm of the left-handed clamp is configured to fit against a side surface of the purlin.

Other embodiments can include a left-handed solar panel clamp device that has a lower structural arm, an upper structural arm, having a clamping structure. The upper structural arm can be coupled to a first side of the lower structural arm at a first angle, and the lower structural arm can include a lip surface coupled to a second side of the lower structural arm at a second angle. The clamping structure can include anchor elements. The lower structural arm and the lip surface can be dimensioned to match up with another corresponding solar panel clamp device. In such a solar panel clamp device, the anchor elements can include angled pins or fins.

Another embodiment can include a right-handed solar panel clamp device that has a lower structural arm, and an upper structural arm, having a clamping structure, and coupled to a first side of the lower structural arm at a first angle. In such embodiments, the clamping structure can include anchor elements. The lower structural arm can be dimensioned to match up with a lip surface and a dimension of another corresponding solar panel clamp device. In such embodiments, the anchor elements can include angled pins or fins.

Related embodiments can include a method for installing solar panels on a plurality of purlins. Such methods can include forming a plurality of solar panel assemblies. In forming the plurality of solar panel assemblies, a user, manufacturer or installer can attach multiple left-handed clamps to a first side of each of a plurality of solar panel mounting frames. Each of the left-handed clamps can include a lower structural arm, an upper structural arm. The upper structural arm can include a clamping structure and be coupled to a first side of the lower structural arm at a first angle. The lower structural arm can include a lip surface coupled to a second side of the lower structural arm at a second angle.

Such methods can also include attaching multiple right-handed clamps to a second side each of a plurality of solar panel mounting frames, wherein the right-handed clamps each can include a right-handed clamp having a lower structural arm and an upper structural arm. The upper structural arm can include a clamping structure and can be coupled to a first side of the lower structural arm at a first angle. A second side of the lower structural arm of the right-handed clamp can be dimensioned to fit against the second side of the left-handed clamp. A first end of the right-handed clamp can be dimensioned to fit on the lip surface. A first surface of the clamping structure of the left-handed clamp can be dimensioned to match up with a first surface of the clamping structure of the right-handed clamp.

In related embodiments, installing solar panels can also include placing a first solar panel mounting assembly on a first purlin and a second purlin. Placing the first solar panel mounting assembly can include placing or positioning the first side of the first solar panel mounting assembly having the left-handed clamps on a top surface of the second purlin and holding the second side of the first solar panel mounting assembly having the right-handed clamps in a position in alignment with the first purlin. Once the first solar panel mounting assembly is in position, holes can be drilled in the first purlin using through holes in the multiple right-handed clamps as guides. The first solar panel mounting assembly can then be fastened to the first purlin using fasteners, the through holes and the drilled holes.

Such method embodiments can further include positioning a second solar panel mounting assembly on the second purlin and a third purlin. Positioning the second solar panel mounting assembly can include aligning and placing the right-handed clamps of the second solar panel mounting assembly on the lip surfaces of the left-handed clamps of the first solar panel mounting assembly and placing the left-handed clamps of the second solar panel mounting assembly on a top surface of the third purlin. In this configuration, the second solar panel mounting assembly can temporarily be allowed to rest in position while an installer or other user attends to other aspects of the installation process without manually holding the second solar panel mounting assembly in place.

In related embodiments, placing the second solar panel mounting assembly on the second purlin and the third purlin can further include drilling holes in the second purlin by using through holes in the multiple left-handed clamps of the first solar panel mounting assembly and through holes in the multiple right-handed clamps of second solar panel mounting assembly. Once the holes are drilled, the such methods can include fastening the first solar panel mounting assembly and the second solar panel mounting assembly to the second purlin using the through holes in the left-handed clamps of the first solar panel mounting assembly, the through holes in the right-handed clamps of the second solar panel mounting assembly, and the drilled holes in the second purlin. The drilled holes in the first and second purlins can be disposed in vertical surfaces of the first and second purlins. In all embodiments discussed herein, the purlins can include raised beams disposed on a plurality of posts and placing the first solar panel mounting assembly on the first and second purlins and disposing the second solar panel mounting assembly on the second and third purlins can be performed by an installer or other user from a position below the raised beams.

The following detailed description and accompanying drawings provide a better understanding of the nature and advantages of the present invention.

BRIEF DESCRIPTION OF THE DRAWINGS

FIG. 6 is a flowchart of a method for installing solar panels using solar panel clamps according to one embodiment of the present invention.

DETAILED DESCRIPTION

Described herein are techniques for solar panel clamp systems for installing solar panels on ground level or raised purlins. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 1:
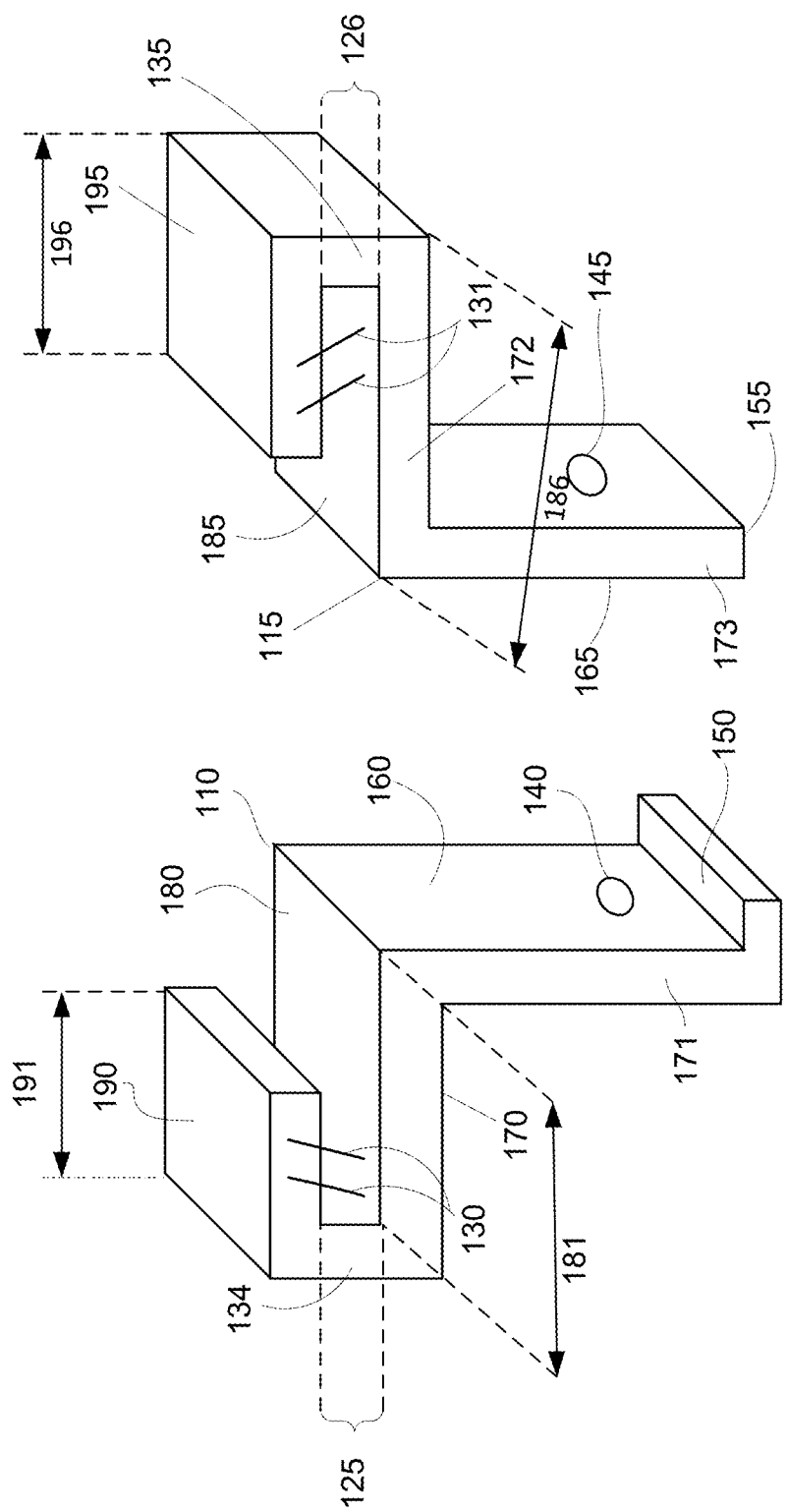
FIG. 1 illustrates an exploded view of a solar panel clamping system according to one embodiment of the present invention.

FIG. 1 shows an exploded view of a left-handed clamp 110 and a corresponding right-handed clamp 115 of a solar panel clamp system, according to various embodiments the present invention. As shown, the left-handed clamp 110 includes two main structural arms 170 and 171 which create an elbow joint at a given or predetermined angle. The upper structural arm 170 can include a clamp region between the bottom of clamp arm 190 and the top surface 180 of upper structural arm 170. The gap 125 on the interior of the clamp region between the bottom of claim structure 190 and the top surface 180 of upper structural arm 170 can be determined based on the maximum thickness of the solar panel mounting frame with which the solar panel clamping system will be used.

The clamping structure of the left-handed clamp 110 can include upper structural arm 170, connecting section 134 and clamp arm 190. The clamping structure of the left-handed clamp 110 can include various ranges of interior volumes based on the difference between the length 181 of the upper structural arm 170 and the length 191 of the clamp arm 190 and the size of connecting section 134. To secure left-handed clamp 110 to the solar panel mounting frame, the clamping structure can include anchor elements 130.

In some embodiments, the anchor elements 130 can include a one-way connection such as one or more barbed or unbarbed pins that are angled inward towards the interior clamp region of the clamping structure. In other embodiments, the anchor elements 130 can include steel fins, made of spring or flexible material such as stainless steel, embedded in the bottom surface of the clamp arm 190 that are angled inward toward the interior of the clamp region. In such embodiments, the combination of the anchor elements 130 within the cavity of the clamp region provides a one-time or one-way connection between the left-handed clamp and the portion of the solar panel mounting rail or frame to which is attached. In other embodiments, the anchor elements can include a threaded hole and screw combination in the clamp arm. In yet other embodiments, the anchor elements 130 can include set screws, bolts, self-tapping sheet-metal screws, and/or adhesives, such as pressure sensitive tape or glue. In various other embodiments the anchor elements 130 can be configured to include or be press fit or friction fit elements having interlocking or keyed corresponding elements or features on the mounting rails. In such embodiments, the clamps can feature a snap lock coupling with the mounting rail or frame. The bottom surface of the solar panel mounting frame to which left-handed clamp 110 is attached can then rest on the top surface 180 of the upper structural arm 170.

The lower structural arm 171, while illustrated as disposed 90° relative to the upper structural arm 170, can be coupled to the upper structural arm 170 at any angle or having any curve or profile suitable for meeting with at least one edge of a purlin with which it will be used. For example, the angle between the upper structural arm 170 and lower structural arm 171 can include both acute and obtuse angles, depending on the solar panel mounting frame and the purlins with which it will used. Additionally, the profile of the curve connecting the upper structural arm 170 and the lower structural arm 171 can include curves having a given radius that would match the purlins with which it will be used. Since most conventional purlins include an edge having approximately a right angle, the remainder of the discussion will be directed to such cases.

The lower structural arm 171 of the left-handed clamp 110 can include a threaded or unthreaded through-hole 140, disposed a predetermined distance from the upper structural arm 170, through which a fastener such as a screw, bolt, pin, or other fastener can be inserted. In other embodiments, the lower structural arm 171 can include snap lock features configured to interlock with corresponding snap lock features on the corresponding purlin. As shown, lower structural arm 171 can also include a lip or shelf surface extending off the bottom of the left-handed solar panel clamp coupled to the side of the lower structural arm 171 opposite the side to which the upper structural arm 170 is attached. The depth of lip surface 150 can be configured to match the thickness of lower structural arm 165, such that the bottom surface 155 of the lower structural arm 165 of the right-handed clamp 115 fits.

Right-handed clamp 115 can also include an upper structural arm 172 and lower structural arm 173. As shown, the two main structural arms 172 and 173 create an elbow joint. In other embodiments, the angle between the two main structural arms 172 and 173 can be coupled to one another such that it creates an elbow joint that is greater than, equal to, or less than 90°.

The upper structural arm 172 can include a clamp region between the bottom of clamp arm 195 and the top surface 185 of upper structural arm 172. The gap 126 in the interior of the clamp region between the bottom of clamp structure 195 and the top surface 185 of upper structural arm 172 can be determined based on the maximum thickness of the solar panel mounting frame with which the solar panel clamping system will be used. In some embodiments, the gap 125 of the left-handed clamp 110 and the gap 126 of the right-handed clamp 115 can be equal. In other embodiments, the gaps 125 and 126 can be different and specifically keyed to accept different thicknesses of solar panel mounting frames disposed on the left and right hand side of the solar panels to help installers correctly attach the left-handed clamp 110 and the right-handed clamp 115 to the correct sides of the solar panel.

The clamping structure of the right-handed clamp 115 can include upper structural arm 172, connecting section 135 and clamp arm 195. The clamping structure of the right-handed clamp 115 can include various ranges of interior volumes based on the difference between the length 186 of the upper structural arm 172 and the length 196 of the clamp arm 195 and connecting section 135. To secure right-handed clamp 115 to the solar panel mounting frame, the clamping structure can also include anchor elements 131.

In some embodiments, the anchor elements 131, as discussed above a reference to left-handed clamp 110, can include a one-way connection such as one or more barbed or unbarbed pins that are angled inward towards the interior of the clamping structure from the clamp arm 195. In other embodiments, the anchor elements 131 can include stainless steel fins embedded in the bottom surface of the clamp arm 195 that are angled inward toward the interior of the clamp region. In such embodiments, the combination of the anchor elements 131 within the cavity of the clamp region provides a one-time or one-way connection between the right-handed clamp 115 and the portion of the solar panel mounting rail or frame to which it is attached. The bottom surface of the solar panel mounting frame to which right-handed clamp 115 is attached can then rest on the top surface 185 of the upper structural arm 172. In all such embodiments, the anchor elements 130 and 131 can provide a grounding path from the solar panel mounting frame to an appropriate grounding strap or coupling. For example, the anchor elements 130 and 131 can be configured to server as UL listed grounding devices per UL 467 and 2703 requirements. The grounding path can be created by a bond path from the anchor element 130 and 131 though the clamps and into the purlin.

The lower structural arm 173, while illustrated as disposed 90° relative to the upper structural arm 172, can be coupled to the upper structural arm 172 at any angle or having any curve or profile suitable for matching with at least one edge of a purlin with which it will be used. For example, the angle between the upper structural arm 172 and lower structural arm 173 can include both acute and obtuse angles, depending on the solar panel mounting frame and the purlins with which it will used. Additionally, the profile of the curve connecting the upper structural arm 172 and the lower structural arm 173 can include curves having a given radius that would match the purlins with which it will be used.

The lower structural arm 173 of the right-handed clamp 115 can include a threaded or unthreaded through-hole 145, disposed a predetermined distance from the upper structural arm 172, through which a fastener such as a screw, bolt, pin, or other fastener can be inserted.

Figure 2:
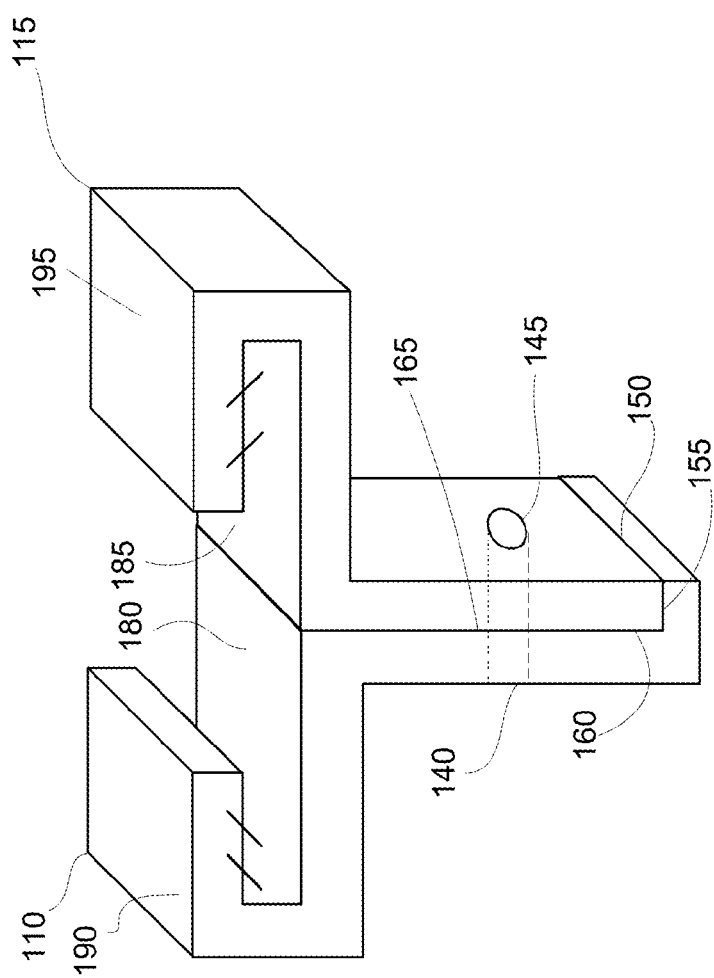
FIG. 2 illustrates an assembled view of a solar panel clamping system according to one embodiment of the present invention.

FIG. 2 shows an assembly drawing of the solar panel clamping system according to various embodiments of the present invention. As shown in FIG. 2, left-handed clamp 110 fits together with right-handed clamp 115 with surfaces 160 of the left-handed clamp 110 in contact with surface 165 of the right-handed clamp 115. According to various embodiments, the left-handed clamp 110 and the right-handed clamp 115 can be assembled in the configuration shown in FIG. 2. In such configurations, surfaces 180 and 185 can be coplanar or near coplanar. Such that the respective solar panel mounting frames, and consequently the respective solar panels, to which each of the mounting clamps is a fixed are also coplanar or near coplanar. In the configuration shown in FIG. 2, a fastener can be inserted through holes 145 and 140, as well as the purlin on which the left-handed solar panel clamp 110 is seated. With such a fastener, both the right-handed solar panel clamp 115 and the left-handed solar panel clamp 110 can be affixed or fastened to the purlin.

Figure 3:
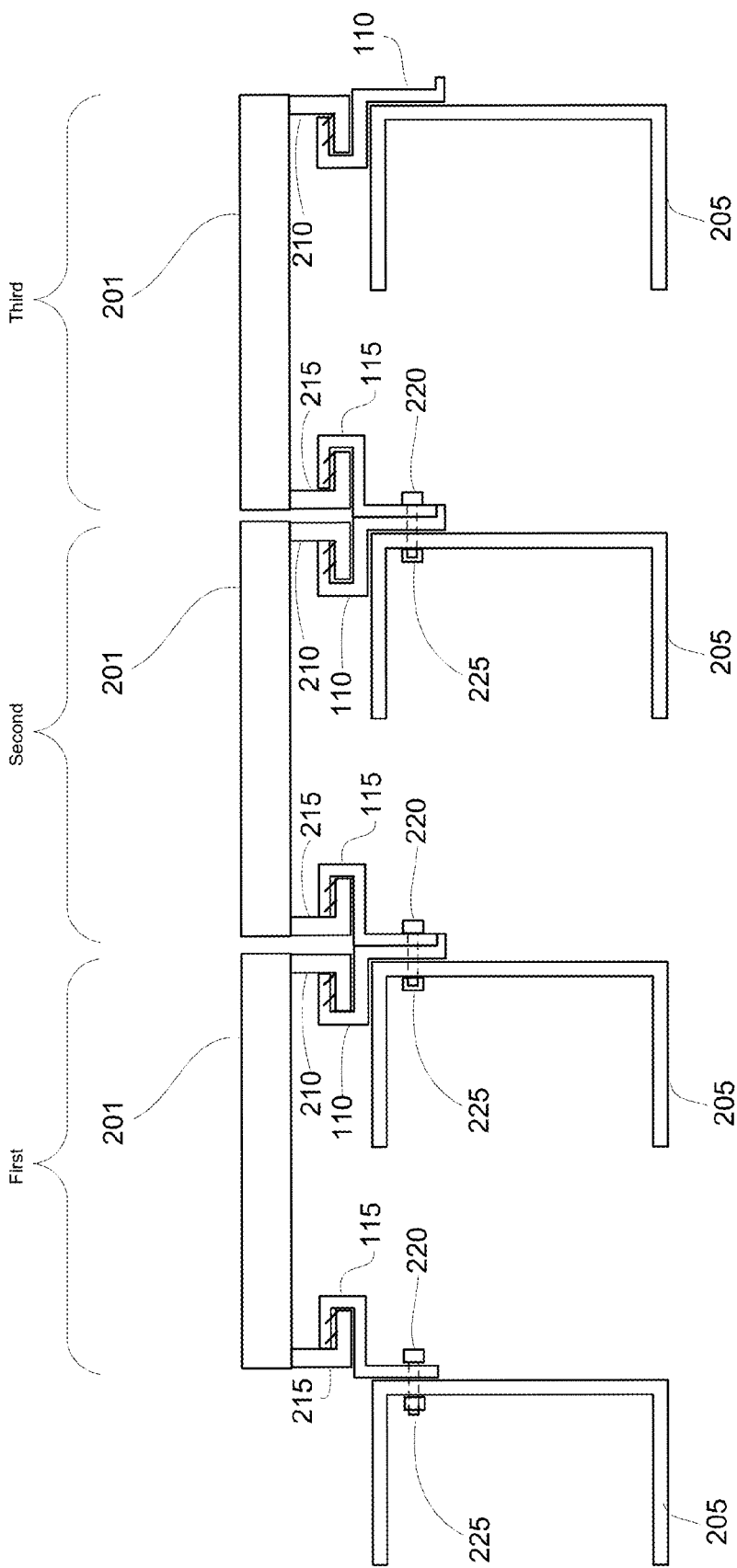
FIG. 3 illustrates an installation assembly using the solar panel clamping system according to one embodiment of the present invention.

FIG. 3 shows a side view of a solar panel installation of solar panels 201 on horizontal C-shaped purlins 205, according to one embodiment of the present invention. As shown, each solar panel 201 can be coupled to left-handed mounting frames or rails 215 and right-handed mounting frames or rails 210. Solar panel clamps are then attached to the mounting frames or rails. In various embodiments, the left-handed solar panel mounting clamps 115 are attached to the left-handed mounting frame 215 and the right-handed solar panel mounting clamps 110 are attached to the right-handed mounting frame 210. As shown, in some embodiments the mounting frames 215 and 210 include an L-shaped bracket, the bottom or horizontal portion of which can be inserted into the clamp region in between the clamp arm and the upper structural arm of the solar panel mounting clamps. Embodiments include anchor elements, in which the insertion of the bottom or horizontal portion of the mounting frame into the solar panel mounting clamps is a one-time connection that does not require the use of additional fasteners or adhesives.

Once all the solar panels are fitted with mounting frames or rails and solar panel mounting clamps, the assemblies are ready to be installed on the C-shaped purlins 205. The first solar panel mounting assembly to be installed, which can include a solar panel 201, mounting rails 215 and 210 with attached solar panel mounting clamps 115 and 110, can be placed on the on the second C-shaped purlin 205 while the installer aligns solar panel clamp 115 with the first C-shaped purlin to drill a guide hole through the purlin using hole 140 as a guide. The installer can then fasten the one or more solar panel clamps 115 to the first C-shaped purlin 205 using a fastener, such as a bolt 220 and a nut 225 or self-tapping screws. The fasteners used to fasten the clamps to the purlins can be or include electrical conductors to provide a ground path from the solar panels and the mounting frames to purlin. Once the first solar panel mounting assembly is attached to the first C-shaped purlin 205 and resting on the second C-shaped purlin, the installer can move on to the next solar panel mounting assembly.

For the next solar panel assembly, the installer can place the right-handed solar panel clamps 115 of the second solar panel mounting assembly onto the lip surface 150 of the left-handed solar panel clamp 110 of the first solar panel mounting assembly. The left-handed solar panel clamp 110 of the second solar panel mounting assembly can rest on the third C-shaped purlin as shown. The ability to rest each successive solar panel mounting assembly on the lip of the left-handed solar panel clamps of the previously installed solar panel mounting assembly and the current C-shaped purlin, allows installers to safely and accurately position each solar panel on the purlins from the underside of the purlins 205. Such purlins can be mounted on posts in structures such as carports, gazebos, pergolas and other raised simple post-and-beam structures.

Once each solar panel mounting assembly is positioned on the lip of the neighboring solar panel clamp and the current C-shaped purlin, the through holes 140 and 145 of the aligned left-handed clamp 110 and the right-handed clamp 115 can be used as guide holes for drilling holes in the purlins in the precise location in the purlin through which a fastener 220 can be inserted. The fastener 220, such as a screw or bolt, can be secured with a nut 225.

Figure 4:
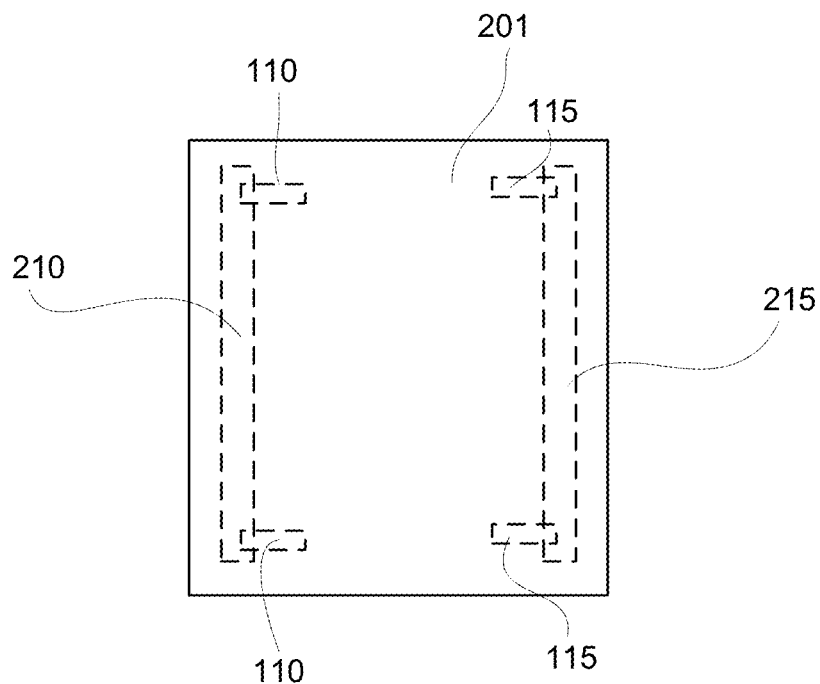
FIG. 4 illustrates a placement of solar panel clamps on a solar panel frame according to one embodiment of the present invention.

FIG. 4 is a simplified diagram of a solar panel mounting assembly 400 according to various embodiments of the present invention. As shown, the solar panel mounting assembly 400 can include a solar panel 201 with left-handed mounting rail 210 and a right-handed mounting rail 215 mounted on the underside of the solar panel 201. The solar panel mounting assembly 400 can also include multiple left-handed clamps 110 attached to the left-handed mounting rail 210 and multiple right-handed clamps 115 attached to the right-handed mounting rail 215. While only two clamps of each variety are shown to be attached to the respective mounting rails, embodiments of the present invention can also include more than two mounting clamps per rail. In such embodiments, the mounting rails can include various rails having a variety of profiles including, but not limited to, I-shaped, C-shaped, Z-shaped, and L-shaped profiles or cross-sections. The connection between each element of the solar panel mounting assembly 400 can provide a grounding path from the solar panel 201 to the ground or ground wire via any number of intervening structures, such as purlins, posts, footings and braces.

Figure 5:
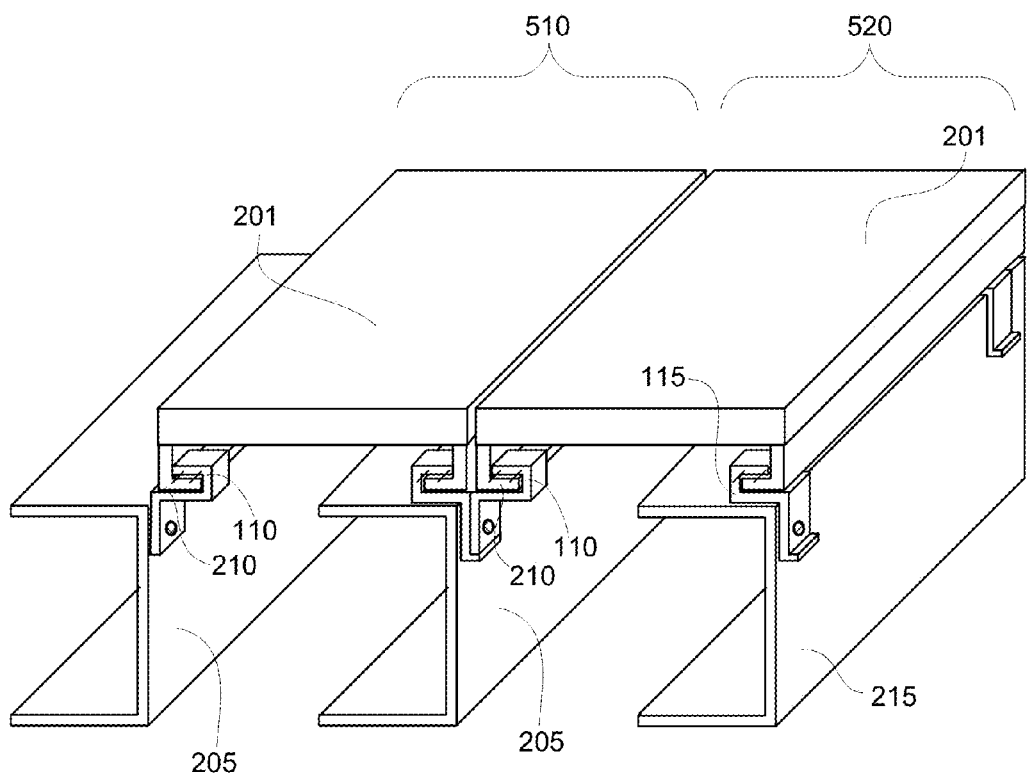
FIG. 5 illustrates a solar panel installation using solar panel clamps according to one embodiment of the present invention.

FIG. 5 shows a view of solar panel mounting assemblies 510 and 520 in position on C-shaped purlins 205. As shown, solar panel mounting assemblies 510 and 520 can include solar panels 201, while in other embodiments, the solar panel mounting assemblies 510 and 520 may include the solar panel mounting frames 210 and 215 and the left-handed-clamps 110 and the right-handed clamps 115 and various fasteners. While solar panel mounting frames 210 and 215 are shown at some distance from the edge of the solar panel 201, other embodiments include disposing the solar panel mounting frames 210 and 215 at, on, or around the edge or perimeter of solar panel 201. Additionally, solar panel mounting frames 210 and 215 can include separate structures, such as the rails shown in FIG. 5, or solar panel mounting frames 210 and 215 can include an integrally formed or assembled structure that can be disposed at or around the perimeter of solar panel 201. For example, the solar panel mounting frame can include a rectangular frame that can be mounted on the back or edge of solar panel 201.

FIG. 6 is a flowchart of a method 600 for installing solar panel assemblies on raised purlins or rails, according to various embodiments of the present invention. The method can begin with attaching solar panel clamps according to various embodiments of the present invention to mounting frames or rails that are coupled to the solar panels in action 610. The solar panel clamps can be attached to the solar panels at the installation site or the solar panel clamps can be attached to the solar panels at the factory. In some embodiments, the solar panel clamps can include clamps of two different varieties or configurations, such as a left-handed clamp configuration and a right-handed clamp configuration, as described herein. In such embodiments, multiple left-handed clamps can be attached to one side of the solar panel mounting frame and multiple right-handed clamps can be attached to the other side of the solar panel mounting frame. As described herein, the solar panel mounting frame can include a frame structure coupled to the solar panel and include at least one surface that is parallel to the solar panel or the upper structural arm 170 or 172. For solar panel installations that include multiple solar panels to be placed on raised purlins, various embodiments of the present invention include attaching the desired number of solar panel clamps to mounting frames for each of the solar panels to be installed to form a plurality of solar panel mounting assemblies.

In action 620, the first solar panel mounting assembly to be positioned between a first purlin and a second purlin by placing the side of the solar panel mounting assembly having the left-handed clamps on the second purlin while holding the side of the solar panel mounting assembly having the right-handed clamps attached in position with the first purlin. During the installation of the first solar panel mounting assembly an installer need only to maintain the position of the right-handed solar panel clamps with respect the first purlin manually. The left-handed solar panel clamps include a profile, such as an L-shaped profile, that can sit on a corresponding shape of the second purlin. In such embodiments, the side of the solar panel mounting assembly that includes left-handed solar panel clamps can securely rest on the second purlin while the installer manipulates and positions the right-handed solar panel clamps to use the through holes in the right-handed solar panel clamps as drill guides to drill holes into the first purlin in action 630. Once the hole in the first purlin are drilled for one solar panel clamp of the first solar assembly, the installer can fasten the right-handed clamp to the first purlin using a fastener inserted through the drilled hole in the purlin and the through hole in the right-handed clamp. In some embodiments, the fastener can include a bolt and nut, while in other embodiments the fastener can include a pin and cotter pin. With the fastener installed for least one of the right-handed solar panel clamps into the first purlin, an installer can repeat the drilling process and fastening procedure for each of the right-handed solar panel clamps in position with the first purlin, in action 640.

Once the first solar panel mounting assembly is fastened to the first purlin via the right-handed solar panel clamps and resting on the second purlin using the left-handed solar panel clamps, installation of the remaining solar panel assemblies can progress quickly and safely from below the plane of the solar panel of the first installed solar panel mounting assembly. For each following solar panel mounting assembly, an installer can place the bottom surface 155 of the right-handed solar panel clamps onto the lip surface 150 of the left-handed solar panel clamp of the previously installed solar panel mounting assembly, while resting the left-handed solar panel clamp on the next purlin, in action 650.

In action 660, with the current solar panel mounting assembly resting stably on the lip surface 150 of the previously installed solar panel mounting assembly and the next purlin, installer can use the through holes in the left-handed clamps of the previously installed solar panel mounting assembly and the through holes in the right-handed clamps of the current solar panel mounting assembly as guide holes to drill into the previous purlin. In action 670, using the drilled hole and the through holes in the solar panel clamps, and installer can fasten the left-handed clamp of the previously installed solar panel and the right-handed solar panel clamp of the current solar panel mounting assembly to the current purlin using a fastener. Action 650, 660 and 670 can be repeated for the remaining solar panel assemblies.

Once the last solar panel mounting assembly is positioned on the lip surface 150 of the left-handed clamps of the second to last solar panel mounting assembly and the last purlin in a particular row of solar panel assemblies, the installer can use the through holes of the last solar panel mounting assembly's left-handed clamps as guide holes to drill holes into the last purlin. Once the holes are drilled in the last purlin, the installer can fasten the final solar panel mounting assembly to last purlin using the through holes in the left-handed solar panel clamps, the drilled holes, and fasteners, as described above.

Figure 7:
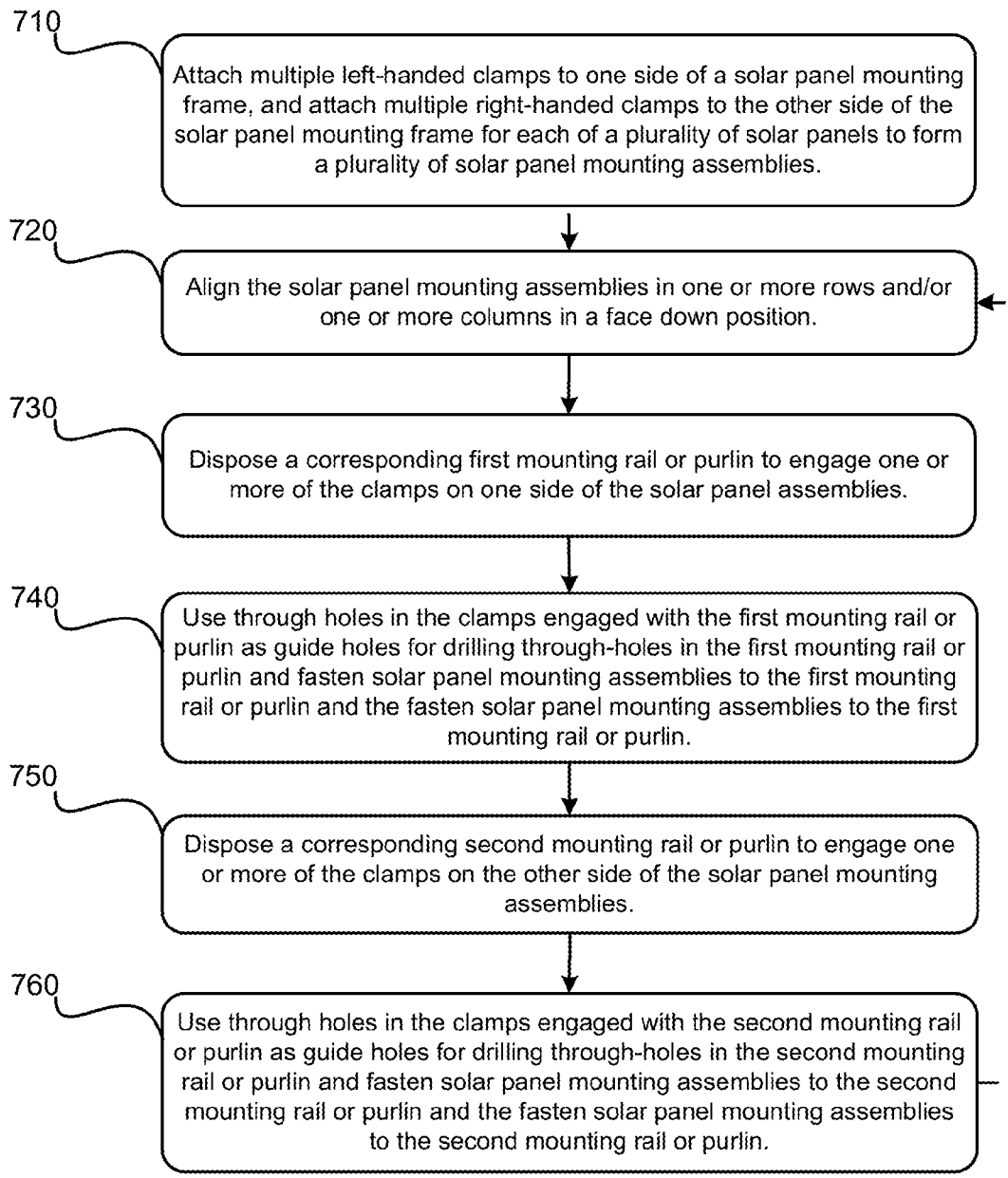
FIG. 7 is a flowchart of a method 700 for pre-assembling solar panel mounting assemblies on-site or off-site for use in both ground or grade level installations and elevated installations.

FIG. 7 is a flowchart of a method 700 for pre-assembling solar panel mounting assemblies on-site or off-site for use in both ground or grade level installations and elevated installations. Action 710 of method 700 is similar to action 610 of method 600 of FIG. 6, and includes attaching multiple left-handed and right-handed clamps to the corresponding mounting frames for each of a plurality of solar panels to form a plurality of solar panel mounting assemblies. The solar panel mounting assemblies can then be arranged or aligned in one or more rows and/or columns with the input surface of the solar panels in a facedown position. In such a configuration, the clamps of each solar panel mounting assembly will be facing the assembler or installer, thereby providing access to the lower structural arms protruding from the underside of each solar panel mounting assembly.

In action 730, a first mounting rail or purlin with a surface having a shape corresponding the clamping structure of the mounting clamps can be disposed to engage the mounting clamps. In some embodiments, the solar panel mounting assemblies can be held in place by an assembly jig such that the first mounting rail or purlin can be disposed in a position to engage all of the solar panel mounting assemblies simultaneously. In other embodiments, each of the solar panel assemblies can be arranged to engage the mounting rail or purlin one-by-one.

In action 740, holes in the clamps engaged with the first mounting rail or purlin can be used to drill guide holes through the first mounting rail or purlin while the solar panel mounting assemblies are in the face down position. The mounting clamps can then be fastened to the first mounting rail or purlin using a fastener, such as a nut and bolt combination. In other embodiments, self-tapping screws or bolts can be used to attach the clamps to the mounting rail or purlin through the through holes. In yet other embodiments, the clamps can be configured to snap lock or otherwise engage the first mounting rail or purlin. In some related embodiments, an adhesive or other bonding agent can be used to couple the clamps to the first mounting rail or purlin. Once the clamps on one side of the row or column of solar panel mounting assemblies are coupled to the first mounting rail or purlin, a second mounting rail or purlin can be disposed to engage the clamps on the other side of the row or column of solar panel mounting assemblies, in action 750. The clamps on the other side of the row or column of solar panel assemblies mounting assemblies can then be coupled to the second mounting rail or purlin as described above in reference to the first mounting rail or purlin, in action 760. While the solar panel mounting assemblies are described as being coupled to two mounting rails or purlins, the solar panel mounting assemblies can be coupled to as many mounting rails or purlins as necessary given the particular strength, rigidity, weight, and other requirements of a specific application or the installation site.

When the row or column of solar panel mounting assemblies are coupled to one or more mounting rails or purlins, they form an assembled set of coupled solar panel assemblies. The assembled set of coupled solar panel assemblies, can be used individually in ground or grade level installations in which the assembled rows of coupled solar panel assemblies can be flipped over such that the mounting rails lie on the ground or near ground level footings with the input side of the solar panels facing the sky. In other embodiments, the assembled sets of coupled solar panel assemblies can be hoisted onto posts for raised solar panel installations.

In other embodiments, multiple assembled sets of coupled solar panel assemblies can be coupled to one another to form panels of coupled solar panel assemblies that can be installed at the site of assembly or shipped to another installation site. Actions 720 through 750 can be repeated for multiple rows of solar panel mounting assemblies to form multiple assembled rows of coupled solar panel assemblies.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A method for installing solar panels on a plurality of purlins comprising:

forming a plurality of solar panel mounting assemblies comprising:

attaching multiple left-handed clamps to a first side of each of a plurality of solar panel mounting frames, wherein the left-handed clamps each comprise:
  a lower structural arm;
  an upper structural arm coupled to a first side of the lower structural arm at a first angle, the upper structural arm forming a gap to receive a right side mounting frame therein; and
attaching multiple right-handed clamps to a second side each of a plurality of solar panel mounting frames, wherein the right-handed clamps each comprise a right-handed clamp comprising:
  a lower structural arm;
  an upper structural arm coupled to a first side of the lower structural arm at a first angle, the upper structural arm forming a gap to receive a left side mounting frame therein;
wherein a second side of the lower structural arm of the right-handed clamp is dimensioned to fit against the second side of the left-handed clamp;
disposing a first solar panel mounting assembly on a first purlin and a second purlin,
wherein disposing the first solar panel mounting assembly comprises:
disposing the first side of the first solar panel mounting assembly having the left-handed clamps on a top surface of the second purlin; and
holding the second side of the first solar panel mounting assembly having the right-handed clamps in a position in alignment with the first purlin;
drilling holes in the first purlin using through holes in the multiple right-handed clamps as guides and fastening the first solar panel mounting assembly to the first purlin using fasteners, the through holes and the drilled holes;
disposing a second solar panel mounting assembly on the second purlin and a third purlin;
wherein disposing the second solar panel mounting assembly comprises:
disposing the right-handed clamps of the second solar panel mounting assembly on the lip surfaces of the left-handed clamps of the first solar panel mounting assembly; and
disposing the left-handed clamps of the second solar panel mounting assembly on a top surface of the third purlin; and
wherein disposing the second solar panel mounting assembly on the second purlin and the third purlin further comprises drilling holes in the second purlin by using through holes in the multiple left-handed clamps of the first solar panel mounting assembly and through holes in the multiple right-handed clamps of second solar panel mounting assembly.

2. The method of claim 1, further comprising fastening the first solar panel mounting assembly and the second solar panel mounting assembly to the second purlin using the through holes in the left-handed clamps of the first solar panel mounting assembly, the through holes in the right-handed clamps of the second solar panel mounting assembly, and the drilled holes in the second purlin.

3. The method of claim 2, wherein the drilled holes in the first and second purlins are disposed in vertical surfaces of the first and second purlins.

4. The method of claim 3, wherein the first and second purlin comprise raised beams disposed on a plurality of posts.

5. The method of claim 4, wherein the disposing the first solar panel mounting assembly on the first and second purlins and disposing the second solar panel mounting assembly on the second and third purlins are performed from a position below the raised beams.

\* \* \* \* \*